United States Patent
Kuwabara (10) Patent No.: US 9,354,730 B2
(45) Date of Patent: May 31, 2016

(54) TACTILE SENSATION PROVIDING APPARATUS

(75) Inventor: Megumi Kuwabara, Kanagawa (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 13/516,175

(22) PCT Filed: Nov. 22, 2010

(86) PCT No.: PCT/JP2010/006829
§ 371 (c)(1),
(2), (4) Date: Jun. 14, 2012

(87) PCT Pub. No.: WO2011/074187
PCT Pub. Date: Jun. 23, 2011

(65) Prior Publication Data
US 2012/0249314 A1    Oct. 4, 2012

(30) Foreign Application Priority Data
Dec. 14, 2009    (JP) .................................. 2009-283078

(51) Int. Cl.
| | |
|---|---|
| G08B 6/00 | (2006.01) |
| G06F 3/041 | (2006.01) |
| G06F 3/01 | (2006.01) |
| H03K 17/96 | (2006.01) |

(52) U.S. Cl.
CPC ............... *G06F 3/041* (2013.01); *G06F 3/016* (2013.01); *H03K 17/962* (2013.01); *G06F 2203/04105* (2013.01); *H03K 2217/96062* (2013.01)

(58) Field of Classification Search
None
See application file for complete search history.

(56) References Cited

U.S. PATENT DOCUMENTS

| | | | |
|---|---|---|---|
| 7,205,978 B2 | 4/2007 | Poupyrev et al. | |
| 7,579,758 B2 | 8/2009 | Maruyama et al. | |
| 7,952,566 B2 | 5/2011 | Poupyrev et al. | |
| 8,542,203 B2 * | 9/2013 | Serban et al. | 345/173 |
| 2003/0174121 A1 | 9/2003 | Poupyrev et al. | |
| 2006/0170660 A1 | 8/2006 | Miyata et al. | |
| 2006/0192771 A1 * | 8/2006 | Rosenberg et al. | 345/173 |
| 2008/0024459 A1 * | 1/2008 | Poupyrev et al. | 345/173 |

(Continued)

FOREIGN PATENT DOCUMENTS

| | | |
|---|---|---|
| CN | 101118469 A | 2/2008 |
| CN | 101373414 A | 2/2009 |

(Continued)

OTHER PUBLICATIONS

International Search Report; PCT/JP2010/006829; Mar. 15, 2011.

(Continued)

*Primary Examiner* — Curtis King
(74) *Attorney, Agent, or Firm* — Studebaker & Brackett PC (57) ABSTRACT

A tactile sensation providing apparatus capable of providing a tactile sensation to a user at timing maintaining an operation feeling of the user, even when a light pressure load is applied, is provided. The tactile sensation providing apparatus includes a touch sensor configured to detect a touch input, a load detection unit configured to detect a pressure load on a touch face of the touch sensor, a tactile sensation providing unit configured to vibrate the touch face, and a control unit configured to adjust a standard for providing a tactile sensation and, when the pressure load detected by the load detection unit satisfies the standard, to control drive of the tactile sensation providing unit such that the tactile sensation is provided to an object pressing the touch face.

2 Claims, 9 Drawing Sheets

(56) References Cited

U.S. PATENT DOCUMENTS

| | | | |
|---|---|---|---|
| 2008/0122315 A1 | 5/2008 | Maruyama et al. | |
| 2008/0202824 A1 | 8/2008 | Philipp et al. | |
| 2009/0051667 A1* | 2/2009 | Park et al. | 345/173 |
| 2009/0267902 A1 | 10/2009 | Nambu et al. | |
| 2010/0016014 A1* | 1/2010 | White | 455/556.1 |
| 2010/0265197 A1* | 10/2010 | Purdy et al. | 345/173 |
| 2010/0328053 A1 | 12/2010 | Yeh et al. | |
| 2011/0267300 A1 | 11/2011 | Serban et al. | |

FOREIGN PATENT DOCUMENTS

| | | |
|---|---|---|
| EP | 2026178 A1 | 2/2009 |
| JP | H11-212725 A | 8/1999 |
| JP | 2003-288158 A | 10/2003 |
| JP | 2004-518188 A | 6/2004 |
| JP | 2008-123453 A | 5/2008 |
| JP | 2008-130055 A | 6/2008 |
| JP | 2008-198205 A | 8/2008 |
| KR | 10-2008-0075804 A | 8/2008 |
| KR | 10-2009-0029091 A | 3/2009 |
| TW | 200844825 A | 11/2008 |
| TW | 201101137 A | 1/2011 |
| WO | 02/35461 A1 | 5/2002 |

OTHER PUBLICATIONS

An Office Action issued by the Korean Patent Office on Nov. 27, 2013, which corresponds to Korean Patent Application No. 2012-7018105 and is related to U.S. Appl. No. 13/516,175; with English language concise explanation.

An Office Action issued by the Taiwan Patent Office on Oct. 7, 2013, which corresponds to Taiwan Patent Application No. 100109145 and is related to U.S. Appl. No. 13/516,175; with Concise Explanation.

An Office Action issued by the Taiwanese Patent Office on Mar. 20, 2014, which corresponds to Taiwanese Patent Application No. 100109145 and is related to U.S. Appl. No. 13/516,175; with English language concise explanation.

An Office Action; "Notice of Reasons for Rejection," issued by the Japanese Patent Office on Oct. 29, 2013, which corresponds to Japanese Patent Application No. 2009-283078 and is related to U.S. Appl. No. 13/516,175; with English concise explanation.

An Office Action issued by the Korean Patent Office on May 28, 2014, which corresponds to Korean Patent Application No. 2012-7018105 and is related to U.S. Appl. No. 13/516,175; with English language concise explanation.

Notification of the First Office Action issued by the State Intellectual Property Office of China on Oct. 21, 2014, which corresponds to Chinese Patent Application No. 201080056907 and is related to U.S. Appl. No. 13/516,175; with English language translation.

Notification of the Second Office Action issued by the State Intellectual Property Office of China on Mar. 23, 2015, which corresponds to Chinese Patent Application No. 201080056907 and is related to U.S. Appl. No. 13/516,175; with English language translation.

The extended European search report issued by the European Patent Office on May 18, 2015, which corresponds to European Patent Application No. 10837224.4-1959 and is related to U.S. Appl. No. 13/516,175.

Notification of the Fourth Office Action issued by the State Intellectual Property Office of China on Oct. 19, 2015, which corresponds to Chinese Patent Application No. 201080056907 and is related to U.S. Appl. No. 13/516,175; with English language translation.

An Office Action issued by the Taiwanese Patent Office on Nov. 9, 2015, which corresponds to Taiwanese Patent Application No. 100109145 and is related to U.S Appl. No. 13/516,175; with English language concise explanation.

* cited by examiner

TACTILE SENSATION PROVIDING APPARATUS

CROSS REFERENCE TO RELATED APPLICATION

This application claims priority to and the benefit of Japanese Patent Application No. 2009-283078 (filed on Dec. 14, 2009), the entire contents of which are incorporated herein by reference.

TECHNICAL FIELD

The present invention relates to a tactile sensation providing apparatus having a touch sensor.

BACKGROUND ART

In recent years, input apparatus such as operation units, switches and the like having touch sensors such as touch panels, touch switches and the like to receive input operations by users have been widely used for mobile terminals such as mobile phones and gaming machines, information equipment such as calculators and ticket vending machines, home electric appliances such as microwaves, TV sets and lighting equipment, industrial equipment (FA equipment) and the like.

There are known a variety of types of those touch sensors, such as a resistive film type, a capacitive type, an optical type and the like. However, touch sensors of these types receive a touch input by a finger or a stylus pen and, unlike push-button switches, the touch sensors themselves are not physically displaced even when being touched.

Since the touch sensors themselves are not physically displaced when touched, an operator may not obtain feedback to an input even though the touch input is received. As a result, the operator is likely to input erroneously by touching the same spot multiple times, which may be stressful for the operator.

As methods to prevent such erroneous inputs, there are known methods to visually or auditory confirm the input operations by, for example, generating sounds or by changing a display state, such as colors of input objects such as input buttons and the like graphically depicted in a display unit, according to an input position upon reception of the touch input.

However, such auditory-appealing feedback may be difficult to be confirmed in a noisy environment and is not applicable when the equipment being used is in a silent mode. In addition, in using such visually-appealing feedback, if the input object displayed in the display unit is small, the operator may not be able to confirm the change in the display state, as a view of the input object is blocked by a finger, when the operator is inputting by the finger.

There is also suggested a feedback method relying on neither the auditory-nor visual sensation but instead generating a tactile sensation at operator's fingertip by vibrating the touch sensor when the touch sensor receives an input (for example, see Patent Documents 1, 2).

RELATED ART DOCUMENTS

Patent Documents

Patent Document 1: Japanese Patent Laid-Open No. 2003-288158
Patent Document 2: Japanese Patent Laid-Open No. 2008-130055

SUMMARY OF INVENTION

Technical Problem

The techniques disclosed in the above Patent Documents 1 and 2, however, merely vibrate the touch sensor when the touch sensor receives an input. Therefore, in using the input apparatus having the button switch such as a push-button switch (push-type button switch) graphically depicted on the touch sensor having a low threshold to receive the input, a tactile sensation is provided when the finger or the like lightly contacts (touches) the touch sensor. It may trigger erroneous operations by responding to an unintentional motion (touch) before the operator pushes and bring a feeling of strangeness to the operator upon the unintentional motion (touch). Here, the threshold for the touch sensor to receive a touch input is a threshold at which the touch sensor responds, which is, for a touch sensor of the resistive film type, a threshold of a pressure at which an upper conductive film is contacted to a lower conductive film and, for a touch sensor of the capacitive type, a threshold for detection of an electric signal by contact.

In order to clear such a disadvantage, the applicant has developed a tactile sensation providing apparatus which detects a pressure load on a touch face of the touch sensor and, when the detected pressure load reaches a predetermined standard for providing the tactile sensation, vibrates the touch face of the touch sensor such that the tactile sensation is provided to a pressing object such as the finger or the like.

According to this tactile sensation providing apparatus, since the tactile sensation is provided when the operator pushes the touch face and the pressure load reaches the predetermined threshold, it is possible to allow the operator to perceive reception of an input while reliably preventing erroneous operations triggered by an unintentional touch as described above and the feeling of strangeness.

Figure 9:
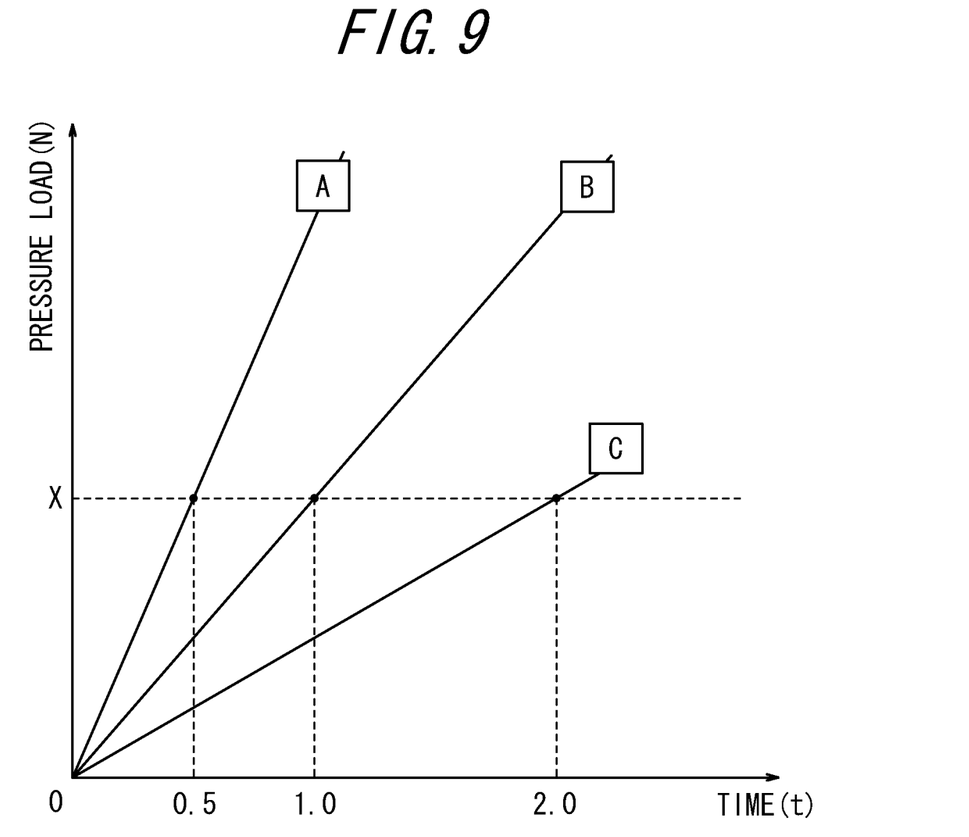
FIG. 9 is a diagram illustrating an example of a change of a pressure load applied by each operator.

However, when the operators press down the touch face, the pressure loads applied on the touch face differ between each of the operators. Also, the same operator may apply different pressure loads on the touch face depending on a manner to hold a terminal or a position on the touch face being touched. As a result of earnest study on a relationship between the pressure load on the touch face and timing to provide the tactile sensation, the inventor found out knowledge described as follows. FIG. 9 is a diagram illustrating an example of a change of a pressure load on the touch face by each of operators A, B and C. As illustrated in FIG. 9, the pressure load applied by the operator A reaches a standard load X for providing the tactile sensation after 0.5 seconds from start of pressing. On the other hand, the pressure loads by the operators B and C reach the standard load X for providing the tactile sensation after 1.0 seconds and 2.0 seconds, respectively, from start of pressing, taking longer than the operator A. That is, a time between start of pressing and reception of the tactile sensation differs between each of the operators, and also between the pressure loads applied by the same operator. Especially when a light pressure load is applied as illustrated by the pressure load of the operator C in FIG. 9, for example, the time between start of pressing and reception of the tactile sensation becomes longer, and the timing to provide the tactile sensation is delayed. As a result, an operation feeling of the operator is impaired.

In order to meet such a request, an object of the present invention is to provide a tactile sensation providing apparatus capable of providing the tactile sensation to a user at timing such that the operation feeling of the user is maintained even when a light pressure load is applied.

Solution to Problem

In order to achieve the above object, a tactile sensation providing apparatus according to a first aspect of the present invention includes:
a touch sensor configured to detect a touch input;
a load detection unit configured to detect a pressure load on a touch face of the touch sensor;
a tactile sensation providing unit configured to vibrate the touch face; and
a control unit configured to adjust a standard for providing a tactile sensation and, when the pressure load detected by the load detection unit satisfies the standard, to control drive of the tactile sensation providing unit such that the tactile sensation is provided to an object pressing the touch face.

A second aspect of the present invention is the tactile sensation providing apparatus according to the first aspect, wherein
the control unit adjusts a standard load for providing the tactile sensation serving as the standard and, when the pressure load satisfies the standard load, controls drive of the tactile sensation providing unit such that the tactile sensation is provided to the object pressing the touch face.

A third aspect of the present invention is the tactile sensation providing apparatus according to the first aspect, wherein
the control unit adjusts a standard time for providing the tactile sensation serving as the standard and, when the pressure load having a slope of a predetermined value or higher is maintained for the standard time, controls drive of the tactile sensation providing unit such that the tactile sensation is provided to the object pressing the touch face.

In order to achieve the above object, a tactile sensation providing apparatus according to a fourth aspect of the present invention includes:
a touch sensor configured to detect a touch input;
a piezoelectric element mounted on the touch sensor; and
a control unit configured to adjust a standard for providing a tactile sensation, to detect a pressure load on a touch face of the touch sensor based on an output signal of the piezoelectric element and, when the detected pressure load satisfies the standard, to control drive of the piezoelectric element such that the tactile sensation is provided to an object pressing the touch face.

A fifth aspect of the present invention is the tactile sensation providing apparatus according to the fourth aspect, wherein
the control unit adjusts a standard load for providing the tactile sensation serving as the standard and, when the pressure load satisfies the standard load, controls drive of the piezoelectric element such that the tactile sensation is provided to the object pressing the touch face.

A sixth aspect of the present invention is the tactile sensation providing apparatus according to the fourth aspect, wherein
the control unit adjusts a standard time for providing the tactile sensation serving as the standard and, when the pressure load having a slope of a predetermined value or higher is maintained for the standard time, controls drive of the piezoelectric element such that the tactile sensation is provided to the object pressing the touch face.

Effect of the Invention

According to the tactile sensation providing apparatus of the present invention, the standard for providing the tactile sensation is adjusted based on the pressure load applied by a pressing object such as a user's finger or the like. Therefore, the tactile sensation may be provided to a user at timing such that an operation feeling of the user is maintained even when a light pressure load is applied by the user.

DESCRIPTION OF EMBODIMENTS

Embodiments of a tactile sensation providing apparatus according to the present invention will be described with reference to the accompanying drawings.

(First Embodiment)

Figure 1:
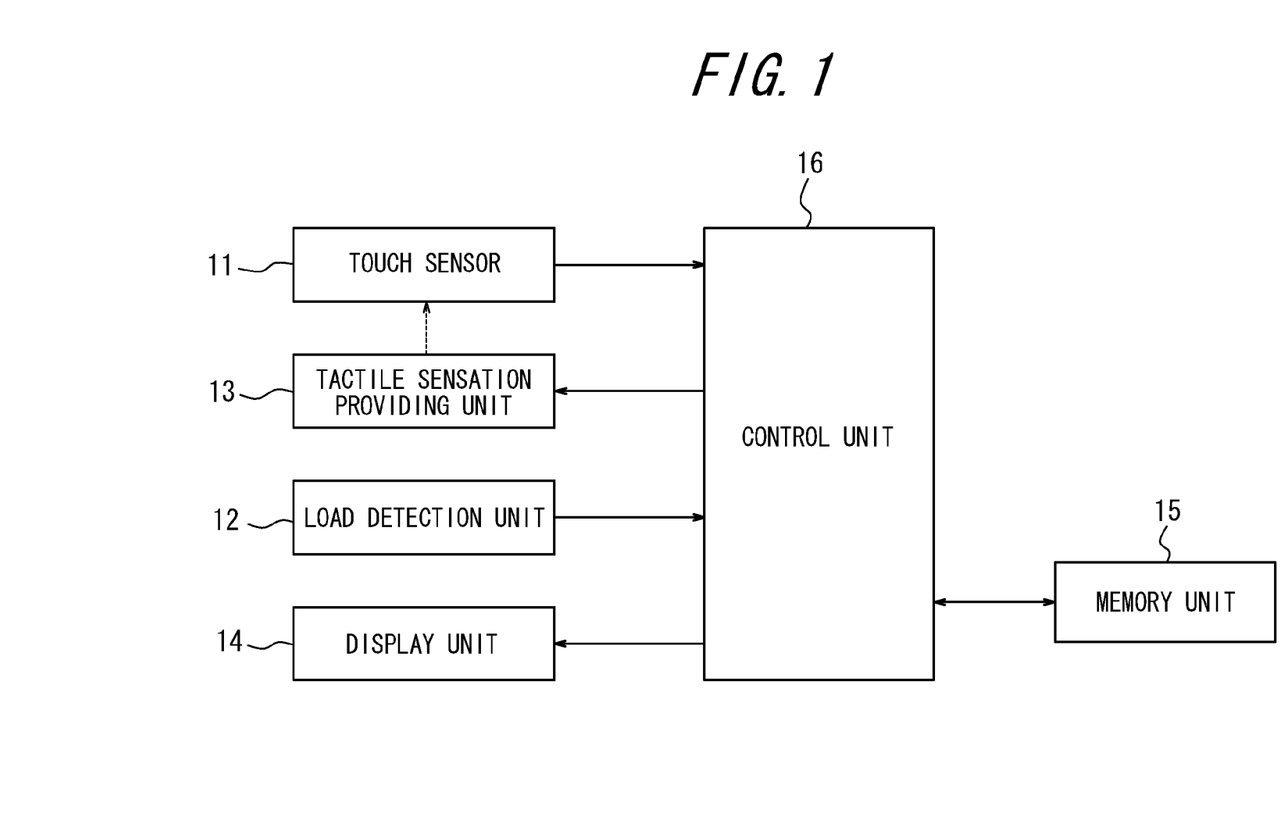
FIG. 1 is functional block diagram illustrating a tactile sensation providing apparatus according to a first embodiment of the present invention.

FIG. 1 is a functional block diagram illustrating a tactile sensation providing apparatus according to a first embodiment of the present invention. The tactile sensation providing apparatus includes a touch sensor 11, a load detection unit 12, a tactile sensation providing unit 13, a display unit 14, a memory unit 15, and a control unit 16 to control overall operations.

The touch sensor 11 is disposed on the display unit 14 and detects a touch input to a touch face by a touch object such as a finger and the like and may include a known type, such as a resistive film type, a capacitive type, an optical type and the like to output two-dimensional position information of a touch position (pushed position of a pressing object such as the finger and the like). The load detection unit 12 detects the pressure load by the pressing object such as the finger and the like on the touch face of the touch sensor 11 and is constituted by using, for example, a strain gauge sensor, a piezoelectric element or the like, which linearly reacts to the load. The tactile sensation providing unit 13 vibrates the touch sensor 11 and is constituted by using, for example, the piezoelectric element.

The display unit 14 displays an input object such as an input button like a push-button switch (push-type button switch) and the like, and is constituted by using, for example, a liquid crystal display panel, an organic EL display panel or the like. The touch input to the input object displayed on the display unit 14 is detected by the control unit 16 based on the position information output from the touch sensor 11. The memory unit 15 stores various information such as drive signal information for the tactile sensation providing unit 13 and is constituted by using, for example, a volatile or a nonvolatile memory. The control unit 16 may be, for example, a CPU or the like and adjusts a standard for providing a tactile sensation based on pressure load information from the load detection unit 12. Also, the control unit 16, when the standard is satisfied, controls drive of the tactile sensation providing unit 13 based on the drive signal information stored in the memory unit 15.

The drive signal information for the tactile sensation providing unit 13 stored in the memory unit 15 includes various information such as a frequency and the number of vibration cycles to vibrate the touch face for each tactile sensation to provide to a user.

The control unit 16 controls drive of the tactile sensation providing unit 13 based on the drive signal information stored in the memory unit 15, so that the pressing object such as the finger and the like is provided with various tactile sensations such as, for example, a "throbbing" sensation, a "vibrating" sensation and a "plock" sensation. Here, when the tactile sensation providing unit 13 is constituted by using the piezoelectric element, in order to provide a soft tactile sensations such as the "throbbing" sensation and the "vibrating" sensation, the control unit 16 applies a drive signal, a triangle wave or a sine wave with a frequency of approximately 200 Hz to 500 Hz, for two or three cycles to the piezoelectric element. In order to provide a hard tactile sensation such as the "plock" sensation, the control unit 16 applies a drive signal, a square wave with a frequency of approximately 200 Hz to 500 Hz, for two or three cycles to the piezoelectric element.

In order to further improve an operation feeling of the user, the control unit 16, by controlling drive of the tactile sensation providing unit 13, may also provide a click sensation such as a "ticking" sensation to the pressing object such as the finger and the like. In order to provide the click sensation such as the "ticking" sensation obtained when pressing a hard-type pushbutton switch, the control unit 16 applies the drive signal, a sine wave or a square wave with a frequency of approximately 100 Hz to 200 Hz, for one cycle. When the click sensation such as the "ticking" sensation is provided, the user may obtain the tactile sensation similar to that obtained when pressing the actual push-button switch even when inputting to the input object graphically depicted on the display unit 14. Thereby, the operation feeling of the user is improved. The tactile sensations such as the "throbbing" sensation, the "vibration" sensation, the "plock" sensation and the "ticking" sensation described in the present specification are Japanese expressions of the sensations obtained by the operator. Examples of drive signals to provide the actual tactile sensations are set forth above.

Figure 2:
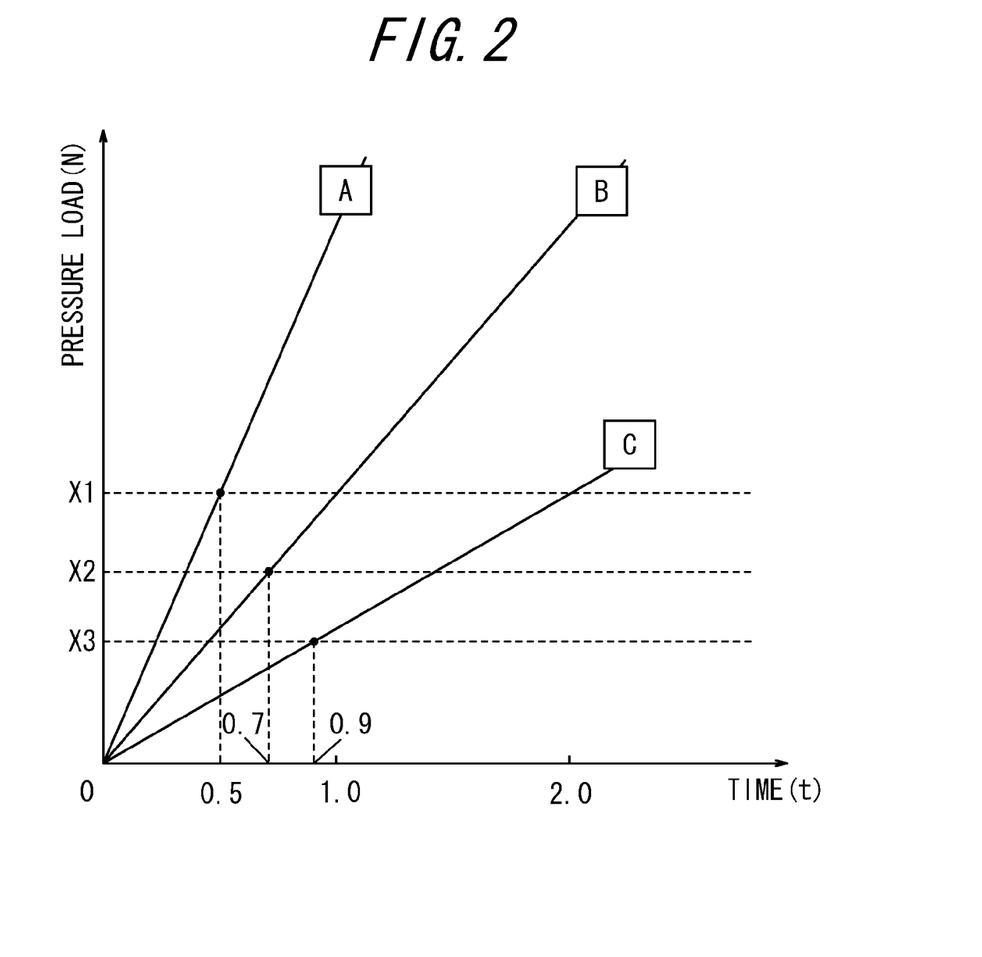
FIG. 2 is a diagram illustrating an example of adjustment of a standard load for providing a tactile sensation.

The control unit 16 may adjust a standard load for providing the tactile sensation serving as the standard. That is, the control unit 16 may control timing to provide the tactile sensation by adjusting a load threshold for the pressure load output from the load detection unit 12. FIG. 2 is a diagram illustrating an example of adjustment of the standard load for providing the tactile sensation. The control unit 16, for each of operators A, B and C, adjusts standard loads (X1, X2 and X3) for providing the tactile sensation based on the pressure load. In this case, a high standard load X1 is set for the operator A applying a strong pressure load, a moderate standard load X2 is set for the operator B applying a moderate pressure load, and a low standard load X3 is set for the operator C applying a light pressure load. The pressure load applied by the operator A reaches the standard load X1 for providing the tactile sensation at 0.5 seconds after start of pressing, which is timing when the operator A may receive the tactile sensation. The pressure load applied by the operator B reaches the standard load X2 for providing the tactile sensation at 0.7 seconds after start of pressing, which is timing when the operator B may receive the tactile sensation. The pressure load applied by the operator C reaches the standard load X3 for providing the tactile sensation at 0.9 seconds after start of pressing, which is timing when the operator C may receive the tactile sensation. Since the standard load for providing the tactile sensation is adjusted based on the pressure load as described above, unlike a case in which a common standard load (X) is used alone as illustrated in FIG. 9, for example, a time between start of pressing and reception of the tactile sensation does not become too long even when a light pressure load is applied. Therefore, the operation feeling of the operator is maintained.

Figure 3:
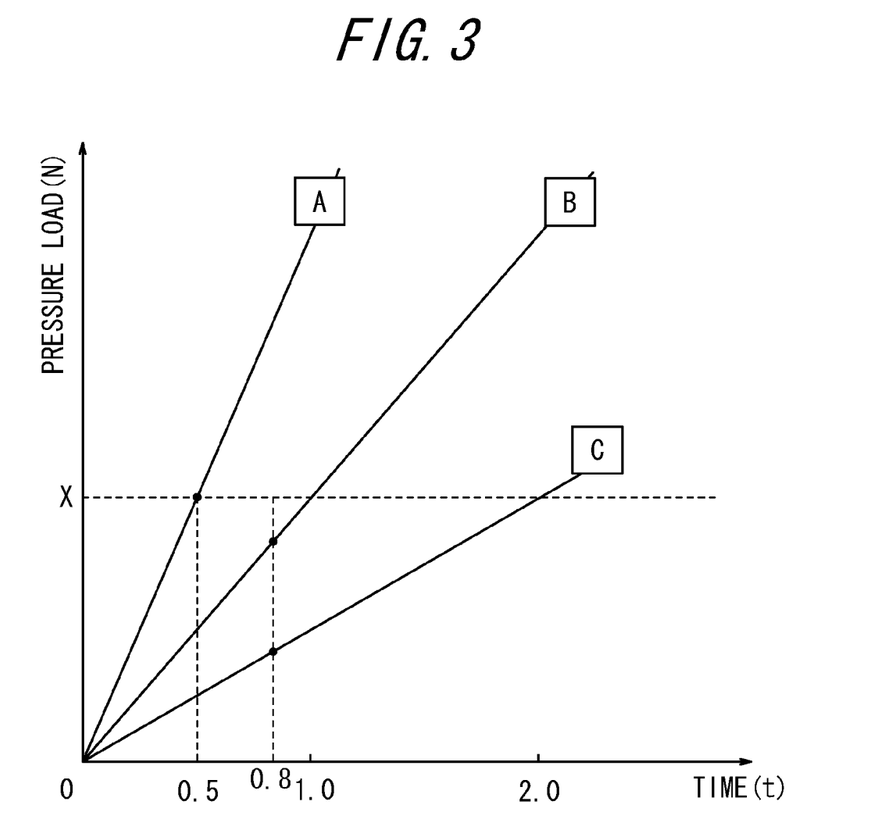
FIG. 3 is a diagram illustrating an example of adjustment of a standard time for providing the tactile sensation.

The control unit 16 may also adjust a standard time for providing the tactile sensation serving as the standard. That is, the control unit 16 may control the timing to provide the tactile sensation by adjusting a time required for providing the tactile sensation after start of pressing. FIG. 3 is a diagram illustrating an example of adjustment of the standard time for providing the tactile sensation. The control unit 16, for each of the operators B and C, adjusts the standard time (0.8 seconds) for providing the tactile sensation based on the pressure load. In this case, a strong pressure load applied by the operator A may reach a standard load X for providing the tactile sensation at 0.5 seconds after pressing, which is within the standard time, and at this timing the operator A may receive the tactile sensation. On the other hand, a moderate pressure load applied by the operator B and a light pressure load applied by the operator C may not reach the standard load X for providing the tactile sensation within the standard time. However, at 0.8 seconds after start of pressing, which is the standard time, the control unit 16 controls drive of the tactile sensation providing unit 13 such that the tactile sensation is provided to the operators B and C. At this timing, the operators B and C may receive the tactile sensation. Since the standard time for providing the tactile sensation is adjusted based on the pressure load as described above, unlike the case in which the common standard load (X) is used alone as illustrated in FIG. 9, for example, the time for receiving the tactile sensation after start of pressing does not become too long even when a light pressure load is applied. Therefore, the operation feeling of the operator may be maintained.

The control unit 16 may not only control provision of the tactile sensation based on whether the pressure load is maintained for the standard time but also take account of a slope (changing manner) of the pressure load. For example, the control unit 16, by determining whether the pressure load having a slope of a predetermined value or higher is maintained for the standard time, may determine whether a pressing operation is "a hold down operation (an input maintaining a uniform pressure load)" or "a press down operation (an input increasing the pressure load)". That is, by taking account of the slope of the pressure load, the control unit 16 may appropriately determine the "press down operation" and control such that the tactile sensation is provided in response only to the "press down operation".

Further, the control unit 16 may adjust both of the standard load and the standard time based on the pressure load. The standard for providing the tactile sensation to be adjusted by the control unit 16 is not limited to the standard load and the standard time described above but may be any standard usable for determination to provide the tactile sensation.

Figure 4:
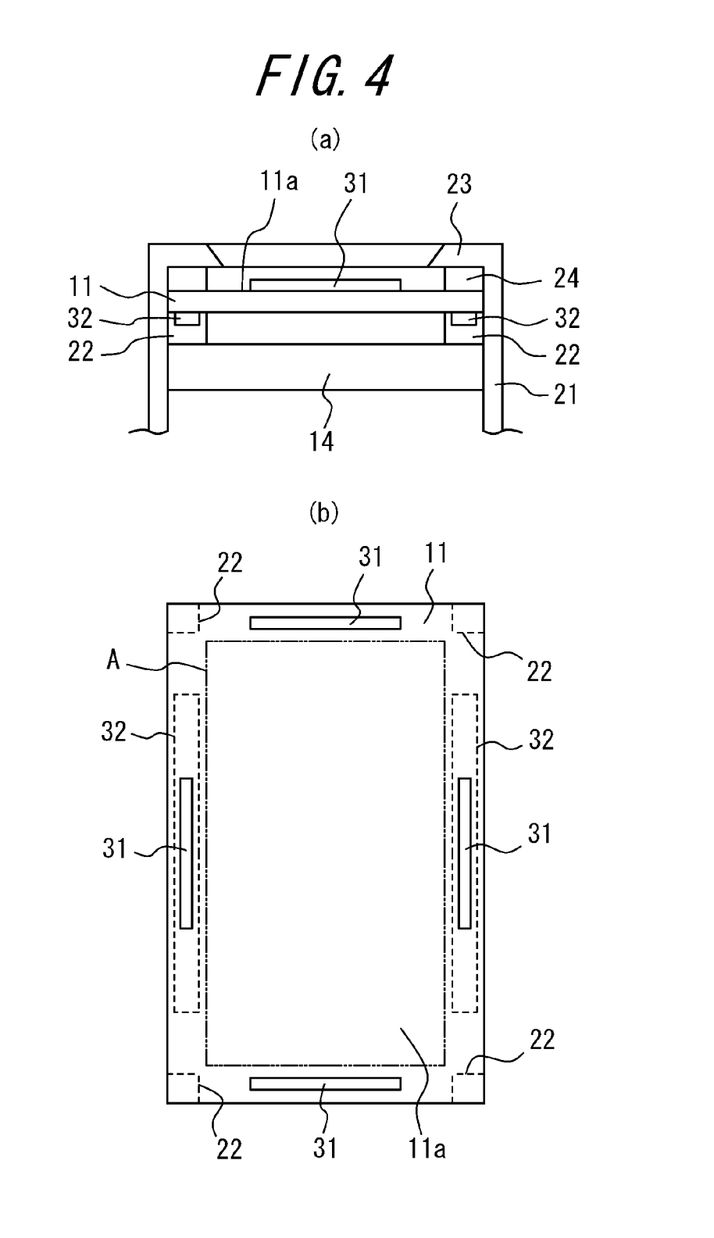
FIG. 4 is diagram illustrating an exemplary implementation structure of a part including a touch sensor illustrated in FIG. 1.

FIG. 4 illustrates an exemplary implementation structure of a part including the touch sensor 11 illustrated in FIG. 1;

FIG. 4(a) is a cross-sectional view of a main section, and FIG. 4(b) is a plane view of the main section. The display unit 14 is accommodated and held in a housing 21. The touch sensor 11 is disposed on the display unit 14 via insulators 22 made of elastic members. According to the present embodiment, the touch sensor 11 and the display unit 14 are rectangular in shape in a planer view and the touch sensor 11 is held on the display unit 14 via the insulators 22, which are arranged at the four corners outside a display area A of the display unit 14 indicated by a chain double-dashed line in FIG. 4(b).

In addition, the housing 21 is provided with an upper cover 23 covering a surface area of the touch sensor 11 outside the display area of the display unit 14. Insulators 24 made of elastic members are arranged between the upper cover 23 and the touch sensor 11.

The touch sensor 11 illustrated in FIG. 4 may have, for example, a surface member having the touch face 11a and constituted by using a transparent film or the glass, and a rear face member made of glass or acryl. The touch sensor 11 is designed such that, when the touch face 11a is pressed down, the pushed position or an entire structure is bent (strained) slightly in accordance with a pressure force.

A load sensor 31 constituted by using the strain gauge sensor or the piezoelectric element to detect a load (pressuring force) applied on the touch sensor 11 is provided, adhered or the like, on the surface of the touch sensor 11 at a position close to each side covered by the upper cover 23. In addition, a piezoelectric element 32 to vibrate the touch sensor 11 is provided, adhered or the like, on the rear face of the touch sensor 11 close to each of two opposed sides. That is, the tactile sensation providing apparatus illustrated in FIG. 4 has the load detection unit 12 illustrated in FIG. 1 constituted by using four strain gauge sensors 31 and the tactile sensation providing unit 13 constituted by using two piezoelectric elements 32. The tactile sensation providing unit 13 vibrates the touch sensor 11 to vibrate the touch face 11a such that the tactile sensation is provided to the touch object on the touch face 11a. Note that the housing 21, the upper cover 23 and the insulator 24 illustrated in FIG. 4(a) are omitted in FIG. 4(b).

According to the tactile sensation providing apparatus of the present embodiment, the touch sensor 11 detects a touch operation to the touch face 11a. Then, the control unit 16 adjusts the standard for providing the tactile sensation (for example, the standard load or the standard time) based on the pressure load detected by the load detection unit 12. When the standard for providing the tactile sensation is satisfied, the control unit 16 controls drive of the tactile sensation providing unit 13 such that the tactile sensation is provided to the object pressing the touch face 11a.

Figure 5:
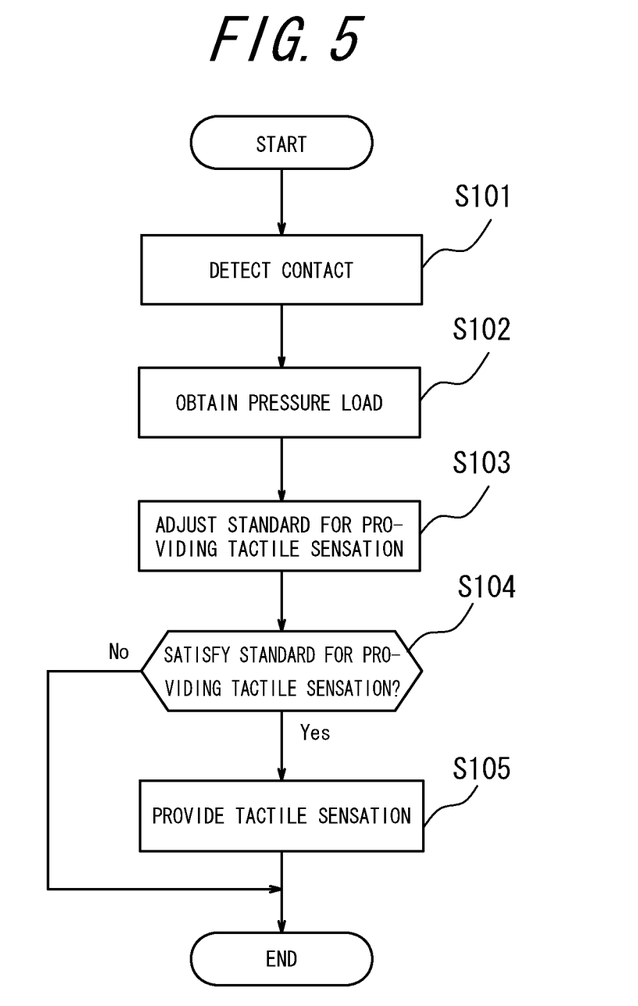
FIG. 5 is a flowchart illustrating an operation to provide a tactile sensation by the tactile sensation providing apparatus according to the first embodiment.

The following is a description of an operation to provide the tactile sensation by the tactile sensation providing apparatus according to the present embodiment, with reference to a flowchart illustrated in FIG. 5.

First, when the control unit 16 detects a contact to the touch face 11a by the finger or the like based on a signal from the touch sensor 11 (step S101), the control unit 16 starts obtaining the pressure load from the load detection unit 12 (step S102). Next, the control unit 16 adjusts the standard for providing the tactile sensation such as the standard load or the standard time based on the pressure load (step S103) and, when the standard is satisfied (Yes at step S104), drives the tactile sensation providing unit 13 with the drive signal obtained from the storage unit 15, such that the tactile sensation is provided to the user (step S105). When the control unit 16 adjusts the standard load at step S103, the control unit 16 determines at step S104 whether the pressure load input from the load detection unit 12 satisfies an adjusted standard load.

When the control unit 16 adjusts the standard time at step S103, the control unit 16 determines at step S104 whether the pressure load input from the load detection unit 12 satisfies an initial (unadjusted) standard load (for example, 1.0 N) for providing the tactile sensation or whether the pressure load at a slope of a predetermined value or higher is maintained for an adjusted standard time. The adjustment of the above standard may be conducted based on the slope of the increasing pressure load. For example, it is preferable to adjust the standard such that the timing to provide the tactile sensation is later than the initial timing when the slope is steep, and such that the timing to provide the tactile sensation is earlier than the initial timing when the slope is gentle.

According to the tactile sensation providing apparatus of the present embodiment, when the user presses down the touch face 11a of the touch sensor 11, the control unit 16 adjusts the standard for providing the tactile sensation based on the pressure load and, when the standard is satisfied, controls such that the tactile sensation is provided to the pressing object. Accordingly, the tactile sensation may be provided to the operator at timing such that the operation feeling of the operator is maintained even when a light pressure load is applied.

The control unit 16 may adjust the standard load for providing the tactile sensation serving as the standard described above and, when the pressure load satisfies the standard load, control such that the tactile sensation is provided to the pressing object. That is, the control unit 16, by adjusting the load threshold for the pressure load from the load detection unit 12, may control the timing to provide the tactile sensation. Thereby, the tactile sensation may be provided to the operator at timing such that the operation feeling of the operator is maintained even when a light pressure load is applied.

The control unit 16 may also adjust the standard time for providing the tactile sensation serving as the standard described above and, when the pressure load having the slope of a predetermined value or higher is maintained for the standard time, control such that the tactile sensation is provided to the pressing object. That is, the control unit 16, by adjusting the time required for providing the tactile sensation after start of pressing, may control the timing to provide the tactile sensation. Further, by taking account of the slope of the pressure load, the control unit 16 may appropriately determine the "press down operation" and control such that the tactile sensation is provided in response only to the "press down operation". Thereby, the tactile sensation may be provided to the operator at timing such that the operation feeling of the operator is maintained even when a light pressure load is applied.

Also, the control unit 16 may control drive of the tactile sensation providing unit 13 such that the click sensation is provided as the tactile sensation to the operator. Accordingly, the user may obtain the tactile sensation similar to that obtained when pressing the actual button switch even when inputting to the input object graphically depicted on the display unit 14. Thereby, the operation feeling of the user may be further improved.

(Second Embodiment)

Figure 6:
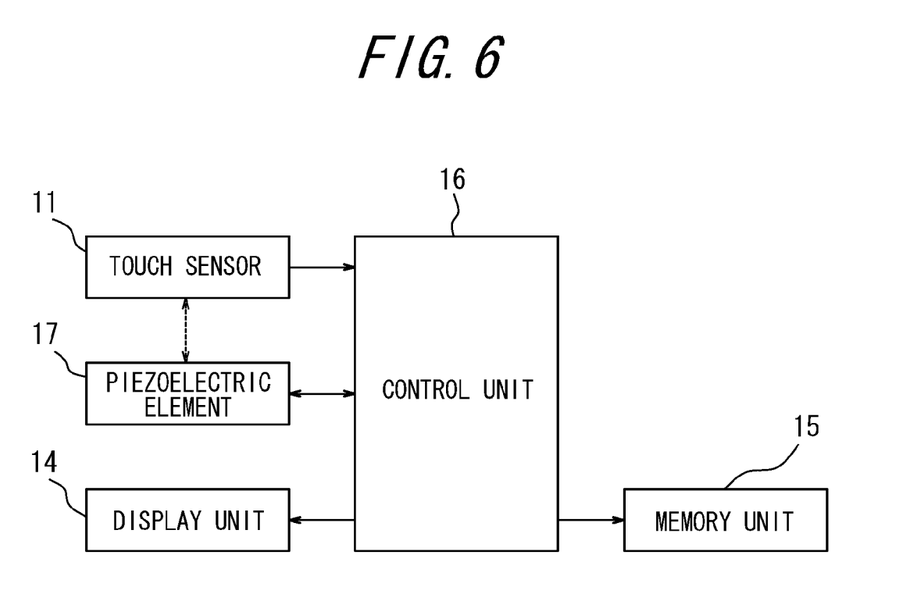
FIG. 6 is functional block diagram illustrating a tactile sensation providing apparatus according to a second embodiment of the present invention.

FIG. 6 is a functional block diagram illustrating a schematic configuration of a tactile sensation providing apparatus according to a second embodiment of the present invention. This tactile sensation providing apparatus has a configuration of that according to the first embodiment illustrated in FIG. 1, except for having the piezoelectric element 17 in place of the load detection unit 12 and the tactile sensation providing unit 13. The touch sensor 11, the display unit 14, the memory unit 15 and the control unit 16 have the same functions as those of the first embodiment, and thus detailed descriptions thereof are omitted. According to the present embodiment, the "load detection unit 12" and the "tactile sensation providing unit 13" in the descriptions of the touch sensor 11, the display unit 14, the memory unit 15 and the control unit 16 of the first embodiment are appropriately substituted for the "piezoelectric element 17".

The piezoelectric element 17 is mounted on the touch sensor 11. The control unit 16 controls the piezoelectric element 17 to operate in one of a load detection mode to detect the pressure load on the touch face 11a of the touch sensor 11 by utilizing direct piezoelectric effect and a tactile sensation providing mode to vibrate the touch face 11a of the touch sensor 11 by utilizing converse piezoelectric effect. In the load detection mode, an output signal corresponding to the pressure load on the touch face 11a of the touch sensor 11 is provided to the control unit 16. In the tactile sensation providing mode, the touch face 11a of the touch sensor 11 is vibrated based on the drive signal supplied from the control unit 16 such that a predetermined tactile sensation corresponding to the drive signal is provided to the pressing object pressing the touch face.

Figure 7:
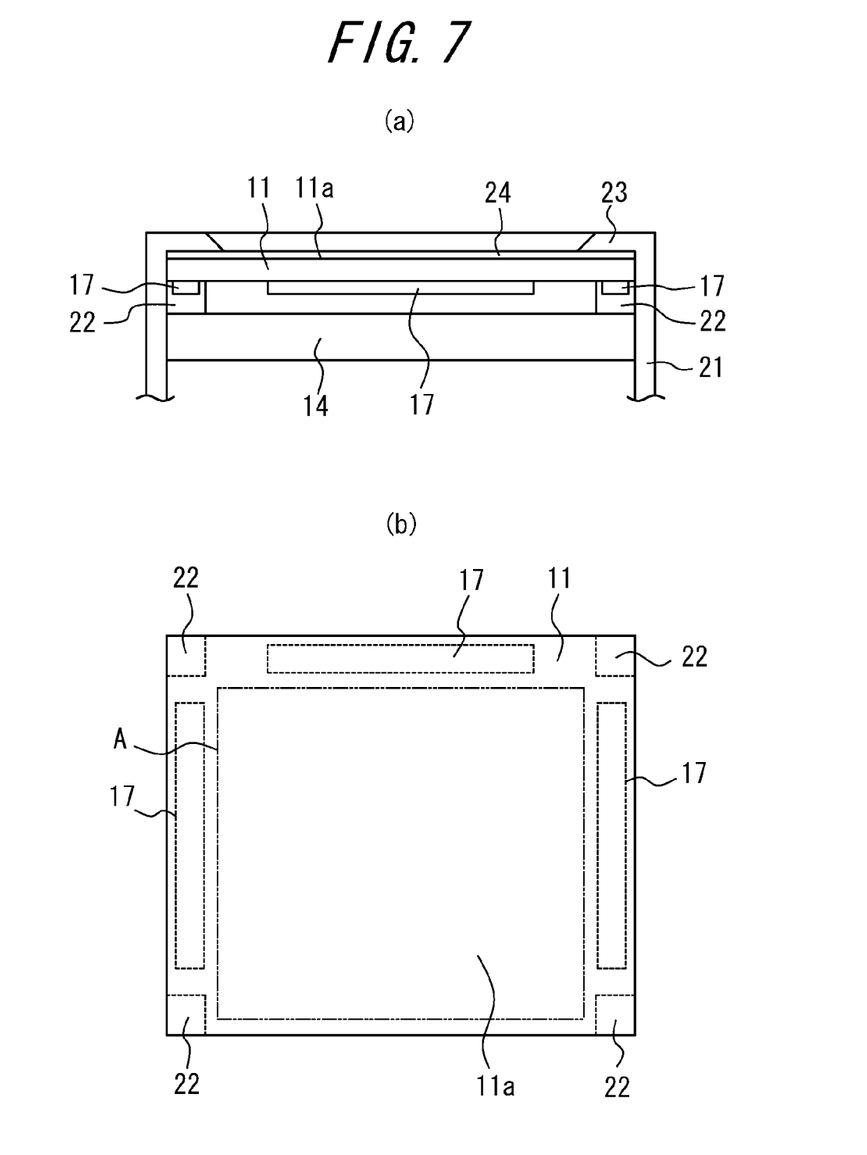
FIG. 7 is diagram illustrating an exemplary implementation structure of a part including the touch sensor illustrated in FIG. 6.

FIG. 7 illustrates an exemplary implementation structure of the touch sensor 11, the piezoelectric element 17 and the display unit 14 illustrated in FIG. 6; FIG. 7(a) is a cross-sectional view of a main section, and FIG. 7(b) is a plane view of the main section. The piezoelectric element 17 is provided on the rear face of the touch sensor 11 at a position covered by the upper cover 23 and close to one or a plurality of sides (here, for example, three sides) in order to detect the pressure load on the touch face 11a of the touch sensor 11 and to vibrate the touch sensor 11 such that the tactile sensation is provided to the pressing object pressing the touch face 11a. Three piezoelectric elements 17 supply the outputs to the control unit 16 in parallel. Note that the housing 21, the upper cover 23 and the insulator 24 illustrated in FIG. 7(a) are omitted in FIG. 7(b).

According to the tactile sensation providing apparatus of the present embodiment, the touch sensor 11 detects the touch operation to the touch face 11a. Then, the control unit 16 adjusts the standard for providing the tactile sensation (for example, the standard load or the standard time) based on the pressure load detected by the piezoelectric element 17. When the standard for providing the tactile sensation is satisfied, the control unit 16 controls drive of the piezoelectric element 17 such that the tactile sensation is provided to the pressing object pressing the touch face 11a.

Figure 8:
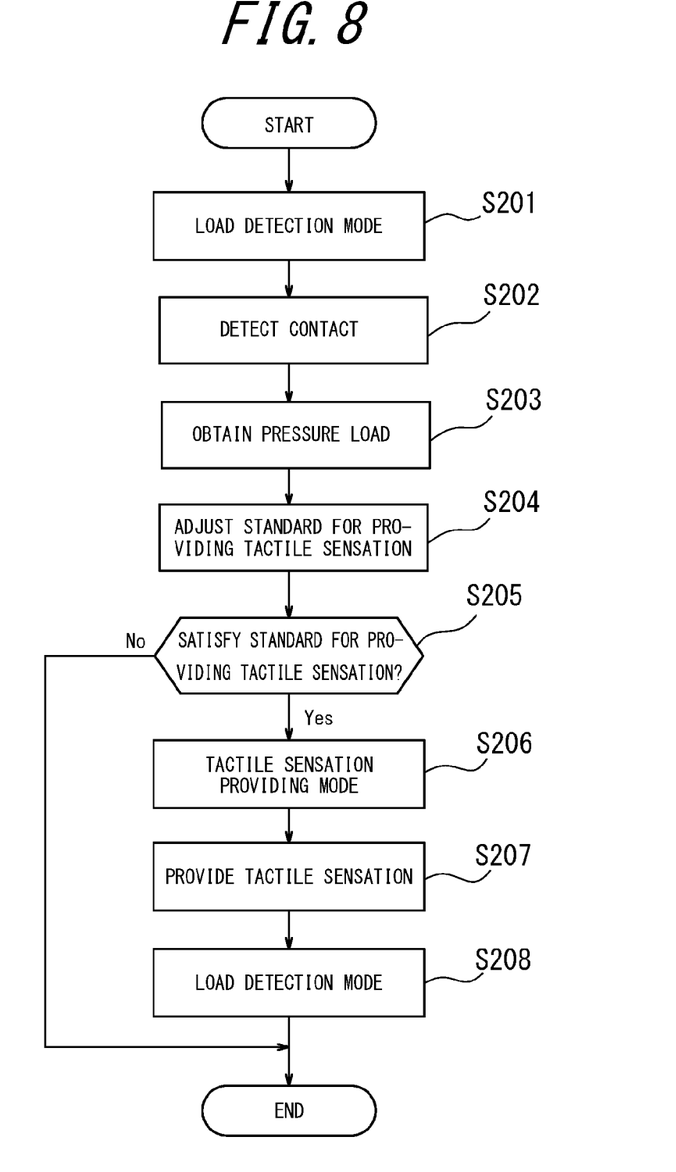
FIG. 8 is a flowchart illustrating an operation to provide the tactile sensation by the tactile sensation providing apparatus according to the second embodiment.

The following is a description of an operation of the tactile sensation providing apparatus according to the present embodiment to provide the tactile sensation as notification information, with reference to a flowchart illustrated in FIG. 8.

First, the control unit 16 sets the three piezoelectric elements 17 in the load detection mode and monitors output signals therefrom (step S201). Subsequently, when the control unit 16 detects a contact to the touch face 11a by the finger or the like based on the signal from the touch sensor 11 (step S202), the control unit 16 starts obtaining the pressure load from the three piezoelectric elements 17 (step S203). Next, the control unit 16 adjusts the standard for providing the tactile sensation such as the standard load or the standard time based on the obtained pressure load (step S204) and, when the standard is satisfied (Yes at step S205), changes the mode of the three piezoelectric elements 17 from the load detection mode to the tactile sensation providing mode (step S206). Then, the control unit 16 drives the tactile sensation providing unit 13 with the drive signal obtained from the memory unit 15 such that the tactile sensation is provided to the user (step S207). Then, the control unit 16 restores the load detection mode (step S208) and calculates the pressure load on the touch sensor 11. When the control unit 16 adjusts the standard load at step S204, the control unit 16, at step S205, determines whether the pressure load input from the three piezoelectric elements 17 satisfies the adjusted standard load. When the control unit 16 adjusts the standard time at step S204, the control unit 16, at step S205, determines whether the pressure load input from the three piezoelectric elements 17 satisfies the initial (unadjusted) standard load (for example, 1.0 N) for providing the tactile sensation or whether the pressure load having the slope of the predetermined value or higher is maintained for the adjusted standard time. It is preferable to adjust the above standard based on the slope of the pressure load. For example, it is preferable to adjust the standard such that the timing to provide the tactile sensation is later than the initial timing, when the slope is steep, and the timing to provide the tactile sensation is earlier than the initial timing, when the slope is gentle.

According to the tactile sensation providing apparatus of the present embodiment, since the piezoelectric element 17 serves dual function as a load sensor to detect the pressure load on the touch face 11a of the touch sensor 11 and an actuator to vibrate the touch face 11a, it enables reduction in the number of components and cost. In addition, reduction in the number of components allows to save space for the components, thereby enabling downsizing of the apparatus.

According to the tactile sensation providing apparatus of the present embodiment, also, when the user applies a pressure load satisfying the standard for providing the tactile sensation on the touch face 11a of the touch sensor 11, the control unit 16 adjusts the standard for providing the tactile sensation based on the pressure load and, when the standard is satisfied, controls such that the tactile sensation is provided to the pressing object. Thereby, the tactile sensation may be provided at timing maintaining the operation feeling of the user even when a light pressure load is applied.

The control unit 16 may adjust the standard load for providing the tactile sensation serving as the standard described above and, when the pressure load satisfies the standard load, control such that the tactile sensation is provided to the pressing object. That is, the control unit 16, by adjusting the load threshold for the pressure load from the piezoelectric element 17, may control the timing to provide the tactile sensation. Thereby, the tactile sensation may be provided to the operator at timing such that the operation feeling of the operator is maintained even when a light pressure load is applied.

The control unit 16 may also adjust the standard time for providing the tactile sensation serving as the standard described above and, when the pressure load having the slope of the predetermined value or higher is maintained for the standard time, control such that the tactile sensation is provided to the pressing object. That is, the control unit 16, by adjusting the time required for providing the tactile sensation after start of pressing, may control the timing to provide the tactile sensation. Further, by taking account of the slope of the pressure load, the control unit 16 may appropriately determine the "press down operation" and control such that the tactile sensation is provided in response only to the "press down operation". Thereby, the tactile sensation may be provided to the operator at timing such that the operation feeling of the operator is maintained even when a light pressure load is applied.

Also, the control unit 16 may control drive of the piezoelectric element 17 such that the click sensation is provided as the tactile sensation to the operator. Accordingly, the user may obtain the tactile sensation similar to that obtained when pressing the actual button switch even when inputting to the input object graphically depicted on the display unit 14. Thereby, the operation feeling of the user may be further improved.

Although the present invention is described based on figures and the embodiments, it is to be understood that various modifications and changes may be implemented by those who are ordinarily skilled in the art. Accordingly, such modifications and changes are included in a scope of the present invention. For example, a function and the like included in each element is rearranged by combining a plurality of elements or by dividing the element without logical inconsistency.

For example, after the load detection unit 12 or the piezoelectric element 17 starts detection of the pressure load and before the pressure load satisfies the adjusted standard for providing the tactile sensation, a pressing sensation is stimulated. Once the standard is satisfied, the tactile sensation providing unit 13 or the piezoelectric element 17 is driven by a predetermined drive signal to vibrate the touch face 11*a* such that a tactile sensation is stimulated. Thereby, the click sensation is provided to the operator such that the operator recognizes that the input operation is completed. Accordingly, even with the button switch such as the push-button switch (push-type button switch) which is graphically depicted on the touch sensor 11, the operator can carry out the input operation to the touch sensor 11 feeling a realistic click sensation similar to that obtained when operating the push-button switch, and thus the operator may not have a feeling of strangeness. Moreover, since the operator may carry out the input operation in conjunction with perception to "have pressed" the touch sensor 11, an erroneous input caused by mere pressing may be prevented.

The standard of the pressure load to provide the tactile sensation may be appropriately set in accordance with a load characteristic of an intended push-button switch in pressing. For example, the standard may be set to be equal to a load at which the touch sensor 11 responds to the touch input (synchronizing timing to provide the tactile sensation with timing of response to the touch input by the touch sensor 11) or to be higher than the load at which the touch sensor 11 responds to the touch input (setting the timing to provide the tactile sensation later than the timing of response to the touch input by the touch sensor 11). For example, when the tactile sensation providing apparatus according to the present embodiments is applied to a mobile terminal, it is preferable to set the standard equal to or higher than the load at which the touch sensor 11 responds to the touch input (setting the timing to provide the tactile sensation later than the timing of response to the touch input by the touch sensor 11). Or, the users may set (adjust) the standard as desired such that an elder user may set it heavier (slower) and a young user may set it lighter (quicker).

In addition, for example, the numbers of tactile sensation providing units 13, load detection units 12 and piezoelectric elements 17 are not limited to the numbers set forth in the embodiments but may take any number. For example, the number of piezoelectric elements 17 is not limited to three but may take any number. Further, the piezoelectric element 17 may have a known configuration such as monomorph, unimorph, bimorph and a laminated type, based on a size of the touch sensor 11, vibration amplitude and the like.

The present invention is effectively applicable to a tactile sensation providing apparatus in which the touch sensor 11 functions as a touch switch for on/off operations. Also, the tactile sensation providing apparatus according to the present invention is capable of providing feelings of a multistep switch, such as a two-step switch (pressed further after pressed), by sequentially providing the tactile sensation on different standards (loads) while the touch sensor 11 is being pressed. Thereby, if the tactile sensation providing apparatus is applied to a release button of a camera, for example, a feeling to lock focus (first step) and a feeling to release (second step) are provided. In addition, in combination with the display unit 14, the tactile sensation providing apparatus may change a display of a menu level screen and the like in a variety of manners in accordance with the steps of pressing. Moreover, when providing the feelings of the multistep switch as described above, the drive signal to vibrate the touch face may be changed at each step in order to provide a different tactile sensation at each step.

According to the present invention, the tactile sensation providing apparatus drives the tactile sensation providing unit 13 or the piezoelectric element 17 when the pressure load detected based on the output of the load detection unit 12 or the piezoelectric element 17 satisfies the standard load for providing the tactile sensation. Here, "when the pressure load detected based on the output of the load detection unit 12 or the piezoelectric element 17 satisfies the standard load for providing the tactile sensation" may represent either "when the detected pressure load reaches a standard value for providing the tactile sensation", "when the detected pressure load exceeds the standard value for providing the tactile sensation", or "when the standard value for providing the tactile sensation is detected based on the output of the load detection unit or the piezoelectric element".

REFERENCE SIGNS LIST

11 touch sensor
11*a* touch face
12 load detection unit
13 tactile sensation providing unit
14 display unit
15 memory unit
16 control unit
17 piezoelectric element
21 housing
22 insulator
23 upper cover
24 insulator
31 load sensor
32 piezoelectric element

The invention claimed is:

1. A tactile sensation providing apparatus comprising:
   a touch sensor configured to detect a touch input of at least one of a plurality of individuals;
   a load detection unit configured to detect a pressure load on a touch face of the touch sensor;
   a tactile sensation providing unit configured to vibrate the touch face; and
   a control unit configured to automatically adjust a standard for providing a tactile sensation to an adjusted standard of load and time for at least one individual of the plurality of individuals, and to control drive of the tactile sensation providing unit such that the tactile sensation is provided to an object pressing the touch face when the pressure load detected by the load detection unit satisfies the adjusted standard.

2. A tactile sensation providing apparatus comprising:
   a touch sensor configured to detect a touch input of at least one of a plurality of individuals;
   a piezoelectric element mounted on the touch sensor; and a control unit configured to automatically adjust a standard for providing a tactile sensation to an adjusted standard of load and time for at least one individual of the plurality of individuals, and to control drive of the piezoelectric element such that the tactile sensation is provided to an object pressing a touch face of the touch sensor when detecting that a pressure load on the touch face of the touch sensor satisfies the adjusted standard based on an output signal of the piezoelectric element.

* * * * *